United States Patent [19]
Brady et al.
[11] 4,115,746
[45] Sep. 19, 1978

[54] MULTIPACTOR DISCHARGE TUNED RESONANT CAVITY DEVICES

[75] Inventors: Michael Barry Brady, Maldon; Peter Frederick Lewis, Chelmsford, both of England

[73] Assignee: English Electric Valve Company Limited, England

[21] Appl. No.: 734,881

[22] Filed: Oct. 22, 1976

[30] Foreign Application Priority Data

Dec. 6, 1975 [GB] United Kingdom ............... 50158/75

[51] Int. Cl.[2] ............................................ H03B 9/10
[52] U.S. Cl. .................................. 331/90; 315/39.57; 331/96; 333/13; 333/99 MP
[58] Field of Search ............................ 331/90, 86, 96; 315/39.55, 39.57; 333/99 MP, 13; 313/103 R, 104

[56] References Cited

U.S. PATENT DOCUMENTS

| | | | |
|---|---|---|---|
| 2,659,027 | 11/1953 | Tonks et al. | 315/39.53 X |
| 3,278,865 | 10/1966 | Forrer | 333/13 |
| 3,748,592 | 7/1973 | Pickering | 333/99 MP X |
| 3,885,221 | 5/1975 | Lewis | 333/99 MP X |

*Primary Examiner*—Siegfried H. Grimm

[57] ABSTRACT

In a vane type magnetron oscillator a resonant co-axial transmission line breaks through the wall of the anode block to couple to two adjacent cavities on either side of a vane. Positioned at a point at which a high radio frequency voltage appears in operation approximately an odd multiple of a quarter wavelength (preferably 3λ/4) from the end of the transmission line adjacent the cavities is a multipactor discharge arrangement. This latter consists of two co-axial cylinders one connected to the inner conductor and the other to the outer conductor of said transmission line. The transmission line extends beyond the multipactor discharge arrangement to a total length approximately half wavelength or a multiple thereof and is short circuited at its end.

7 Claims, 7 Drawing Figures

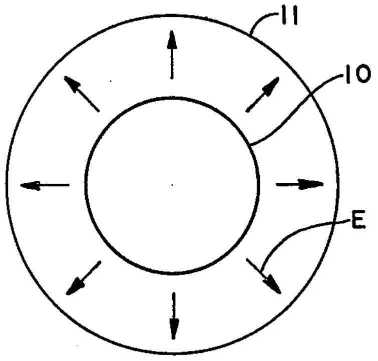
FIG. 4.
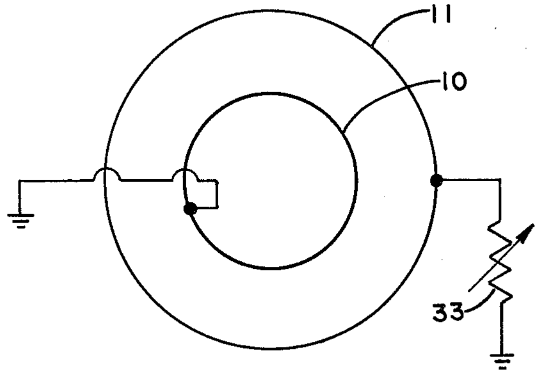
FIG. 5.
FIG. 6.
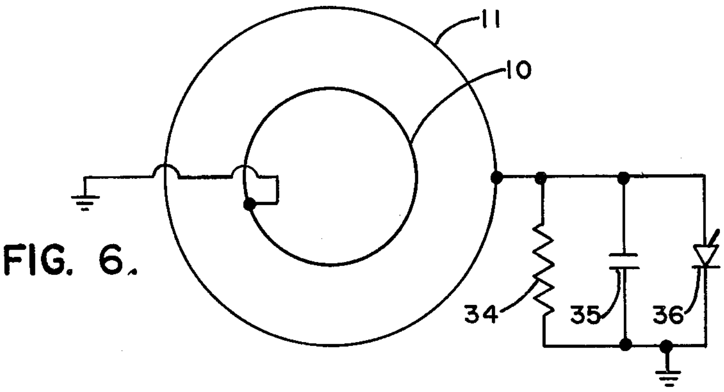
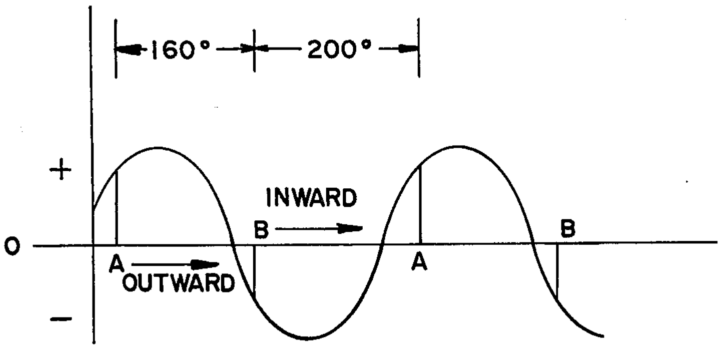
FIG. 7.

MULTIPACTOR DISCHARGE TUNED RESONANT CAVITY DEVICES

This invention relates to multipactor tuned resonant cavity devices and in particular to multipactor discharge tuned magnetron oscillators. Such magnetron oscillators are the subject of U.S. Pat. No. 3,748,592.

In particular, but not exclusively, the present invention seeks to provide an improvement in the invention which is the subject of our co-pending application Ser. number 734,861, filed October 22, 1976.

According to the invention in the co-pending application a resonant cavity device is provided wherein a separate resonator is coupled to a resonant cavity of said device and a multipactor discharge arrangement is provided to influence said separate resonator, said separate resonator comprising a resonant transmission path extending between said multipactor discharge arrangement and said cavity and wherein said transmission path is of such length that said multipactor discharge arrangement is positioned at least approximately at a point at which appears in operation a high radio frequency voltage and which is approximately an odd multiple of a quarter of a wavelength from the end of said transmission path adjacent said cavity.

According to this invention a resonant cavity device is provided wherein a separate resonator is coupled to a resonant cavity of said device and a multipactor discharge arrangement is provided to influence said separate resonator, said separate resonator comprising a resonant transmission path extending between said multipactor discharge arrangement and said cavity and wherein said transmission path is of such length that said multipactor discharge arrangement is positioned at least approximately at a point at which appears in operation a high radio frequency voltage and which is approximately a quarter of a wavelength, or an odd multiple thereof, from the end of said transmission path adjacent said cavity and said transmission path extends beyond said multipactor discharge arrangement to a total length equal to a half wavelength or a multiple thereof, and is short circuited at its end remote from said cavity.

Preferably, and in accordance with the invention in the aforesaid copending application, said multipactor discharge arrangement is positioned at least approximately at a point at which appears in operation a high radio frequency voltage and which is approximately an odd multiple of a quarter of a wavelength from the end of said co-axial transmission path adjacent said cavity, in which case said transmission path is of length equal to a multiple of a half wavelength.

Preferably said resonator cavity device is a magnetron oscillator and said transmission path is a co-axial transmission line, the outer conductor of which terminates at the wall of the anode member of said magnetron oscillator and the inner conductor of which extends through an aperture provided in said wall.

By providing a co-axial transmission line which is short circuited at its end remote from the cavity, not only is the inner conductor of the transmission line more rigidly supported, but, the construction improves the heat dissipation from the inner conductor.

Said inner conductor may be provided with at least one liquid coolant passage having input and output ports at the end of the inner conductor adjacent said short circuit.

In one embodiment of the invention, the multipactor discharge arrangement is in the form of two co-axial cylinders, one of which is carried by and electrically common with said inner conductor and the other of which is separate from the outer conductor of said co-axial transmission line and supported by an electrode passing through said outer conductor by means of an insulator and choke system, whereby bias potential may be applied via said supporting conductor to said outer cylinder.

In another embodiment of the invention, a discontinuity is provided in said inner conductor between said multipactor discharge arrangement and said cavity and the means for short circuiting the end of said transmission line is adjustable whereby the length of the gap provided by said discontinuity may be adjusted to adjust the coupling between the cavity and the multipactor discharge arrangement.

Preferably the total length of said co-axial transmission line is one or one and a half wavelengths.

The invention is illustrated in and further described with reference to the drawings accompanying this specification which illustrate three embodiments of multipactor discharge tuned magnetron oscillators in accordance with the present invention.

In the drawings:

FIG. 4 is a diagrammatic view illustrating certain principles of the multipactor discharge arrangement;

FIG. 5 is a diagrammatic view illustrating one arrangement for self-bias;

FIG. 6 is a diagrammatic view illustrating another arrangement for self-bias; and FIG. 7 is a diagram illustrating the voltages which develop self-bias.

Figure 1:
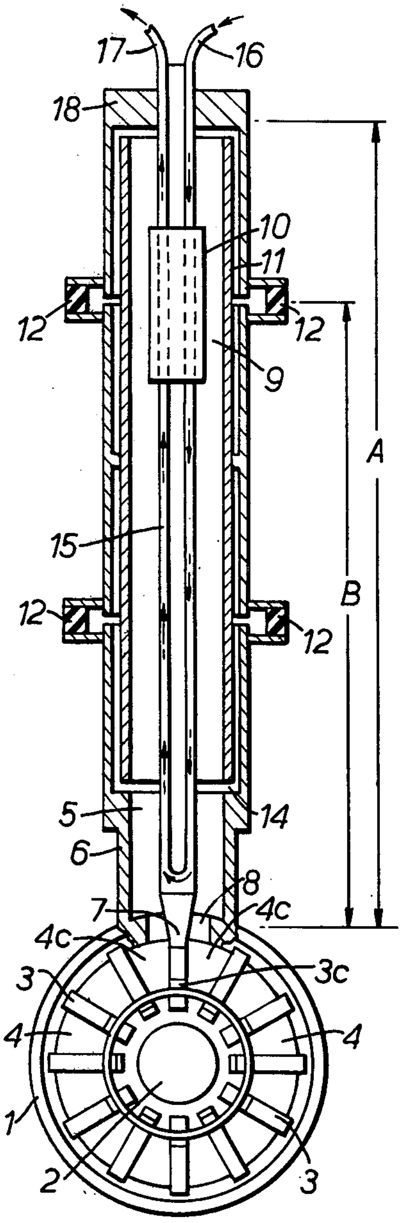
FIG. 1 is a sectional view illustrating one form of the invention.

Referring to FIG. 1, the magnetron oscillator will be seen to be of the vane type. The arrangement consists of cylindrical anode member 1 surrounding a cylindrical cathode member 2. From anode member 1 radial vanes 3 extend inwardly. The anode member 1 with its vanes 3, together provide cavities 4, of which in this example there are twelve, which determine the natural resonant frequency of the magnetron oscillator. A separate resonator is provided consisting of a length of co-axial transmission line 5 coupled to two adjacent ones of the resonant cavities 4, the reference numerals for these adjacent two cavities bearing the suffix "C". The co-axial outer conductor 6 of the co-axial transmission line 5 terminates at the wall of anode member 1, whilst the inner conductor 7 extends through a hole 8 in the wall of anode member 1 and is connected to that one of the vanes 3 (the reference numeral for which bears the suffix "C") which is between the two adjacent cavities 4C. The co-axial transmission line 6, 7 has a total length A equal to one wavelength corresponding to the mean frequency between the two extremes of operating frequency obtained as a result of initiating and inhibiting discharge of multipactor discharge arrangement 9. This latter consists of co-axial cylinders 10 and 11 of which cylinder 11 forms part of the outer conductor of the transmission line, whilst inner cylinder 10 is supported by, and electrically united with inner conductor 7. The multipactor discharge arrangement 9 is positioned at a point which is a distance B, approximately three quarters of a wavelength along the transmission line 5 from the wall of anode member 1, at which a maximum of radio frequency voltage appears in operation.

In order to provide for d.c. biassing and trigger connections the inner and outer conductors 6 and 7 of the co-axial line 5 must be insulated so far as d.c. is concerned. This is achieved by means of insulators 12 and a half wave choke arrangement 14, provided as known per se.

The inner conductor 7 of the co-axial transmission line is in this case formed with a liquid coolant passage 15 having a coolant inlet port 16 and a coolant outlet port 17 at the short circuited end 18 of the co-axial transmission line 5.

Figure 2:
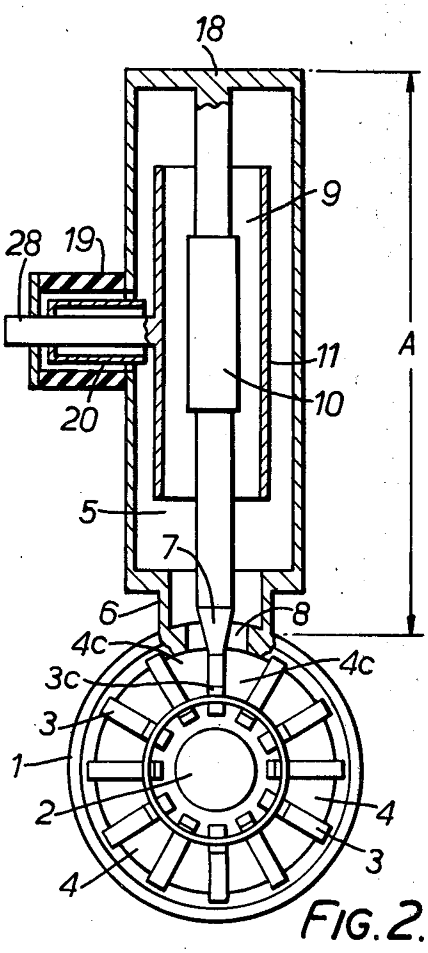
FIG. 2 is a sectional view illustrating a second form of the invention.

Referring to FIG. 2, in this example, the co-axial transmission line 5 has a length A equal to one and a half wavelengths at the mean operating frequency. As with the embodiment shown in FIG. 1 the multipactor discharge arrangement 9 is located at a point, approximately three quarters of a wavelength along the length of the co-axial transmission line 5 from the wall of anode member 1, at which a maximum of radio frequency voltage appears in operation.

In this case, however, the outer cylinder 11 of the two coaxial cylinders 10 and 11 forming the multipactor discharge arrangement 9 is separated from the outer conductor 6 of the transmission line and is carried by an electrode 28 which passes via an insulator 19 and a choke system 20 through the outer conductor 6. In this case bias potential may be applied to the outer cylinder 11 of the multipactor discharge arrangement 9 by means of the electrode 28 and since the cylinder 11 is separated from the outer conductor 6 the need for insulators such as insulators 12 in FIG. 1 and a half wave choke system such as half wave choke system 14 of FIG. 1 does not arise.

In this example, the inner conductor 7 is represented as being solid, that is to say, it has no liquid coolant passage therein. Such a liquid coolant passage may be provided, but in any event the fact that thermally the inner conductor 7 extends to the external surface of the transmission line 5, via the short circuit 18, itself provides a useful heat dissipation effect.

Figure 3:
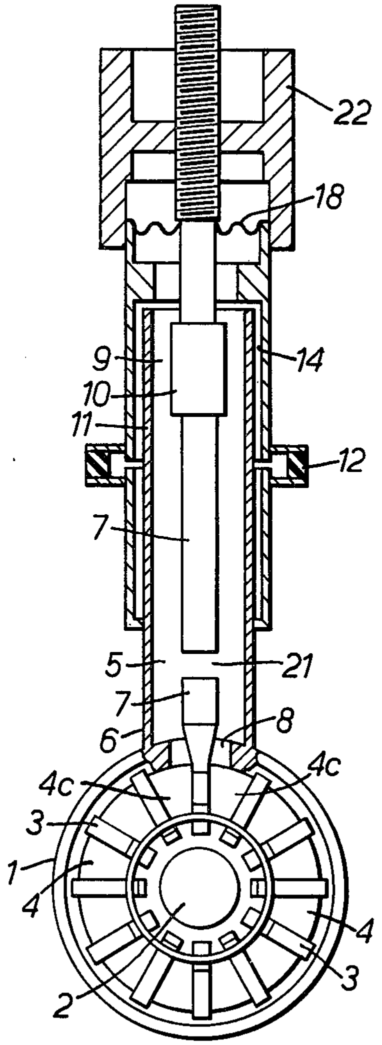
FIG. 3 is a sectional view illustrating a third form of the invention.

Referring to FIG. 3, in this case a discontinuity is provided in the inner conductor 7, which provides a gap 21, the gap 21 is positioned approximately $\lambda/4$ along the transmission line 5, from the wall of anode member 1, at a position at which a minimum of current appears in operation. The short circuit 18 is in this case an adjustable one, movable by means of any convenient mechanism (e.g. a screw mechanism) represented at 22. This permits the longitudinal adjustment of the portion of the inner conductor 7 on the side of the gap 21 adjacent short circuit 18, so as to vary the length of the gap 21. Variation of the length of gap 21 acts to vary the coupling between the cavities 4C and the multipactor discharge arrangement 9.

As disclosed in U.S. Pat. No. 3,748,592, a multipactor discharge arrangement may be employed to tune a magnetron oscillator. As disclosed therein, a resonant cavity is inductively coupled to one of the cavities of a magnetron oscillator so that when the magnetron is operated, the resonant cavity is strongly excited by rf energy coupled from the magnetron. The resonant cavity contains a multipactor discharge arrangement comprising two electrodes disposed in spaced relation and characterized by being secondary electron emissive. When the magnetron is operating and in the absence of electron discharge between the electrodes, the frequency of oscillation of the magnetron is "pulled" by the resonant cavity. When multipactor discharge occurs, the resonant cavity is effectively short circuited and the frequency of oscillation of the magnetron returns nearly to the resonant frequency thereof. The multipactor discharge may be stopped by applying a suitable d.c. voltage across the electrodes.

Copending application Ser. No. 734,861, filed Oct. 22, 1976 and Ser. No. 734,883, filed on even date therewith and referenced therein disclose the combination of a magnetron oscillator and resonant co-axial transmission line coupled with adjacent cavities of the magnetron. The resonant transmission line, as herein, includes a multipactor discharge arrangement. However, unlike the multipactor discharge arrangement of the above patent, the multipactor device of those applications, as herein, is formed by inner and outer co-axial cylinders. The advantage of this arrangement is that during multipactor discharge, a net direct current flows between the electrodes or cylinders which may be used to create a self-bias on the device which affects the frequency of oscillation of the magnetron during multipactor discharge. The self-bias may be developed across a variable resistor 33 as shown in FIG. 5 whereby the oscillating frequency may be tuned over a selected range, or the self-bias may be developed across the RC circuit 34,35 as shown in FIG. 6 whereby the operating frequency will vary with time over a range of frequencies when multipactor discharge is taking place.

The principles of the multipactor discharge arrangement 9 will be apparent from FIG. 4. As a natural consequence of having a coaxial transmission line, a radial electric field E is produced as indicated by the arrows in FIG. 4. The transit time of an electron travelling between the two coaxial cylinders 10 and 11 is dependent upon the direction of transit and is due to the fact that the electric field gradient is greater near the inner cylinder 10 than near the outer cylinder 11, due to the curvatures of these electrodes. Thus, an electron released from the inner cylinder 10 is accelerated to high velocity more quickly, so that it crosses the gap between the two cylinders at a higher average velocity, i.e., in a shorter time than vice versa. For multipactor operation, the total transit angle back and forth has to be 360°. However, with the curved electrodes 10 and 11 the outwards transit angle may be say 160° and the inward transit angle may be say 200°. This is represented pictorially in FIG. 7 and, as will be seen, the instantaneous voltage at B, the outer electrode or cylinder 11, will be less than that at A, the inner electrode or cylinder 10. The magnitude of the space charge limited current is proportional to the instantaneous voltage at the moment of emission, and thus the outward current at A is greater than the inward current at B, so that there is in effect a rectification of the rf energy and production of d.c. current. It is this current which develops the self-bias across the resistor 33 of FIG. 5 or across the RC parallel circuit 34,35 of FIG. 6. In FIG. 6, the self-bias voltage increases until the capacitor 35 is fully charged, causing the operating frequency of the magnetron correspondingly to vary automatically over a particular range. The triggerable diode 36 may be connected across the capacitor 35 by means of which the capacitor may be discharged and the cycle repeated. When the magnetron is operated in pulsed fashion and the triggerable diode 36 ignored, the effect achieved is that the frequency of each pulse will vary during that pulse and the capacitor 35 will tend to discharge between pulses, via the resistor 34, to provide a periodic modulation of the pulses.

In any event, with the cylindrical multipactor discharge electrodes operating as part of a coaxial transmission line, and with the circuit having an external resistance, the system establishes a balance such that a d.c. voltage is developed corresponding to the net current as described above. Since V=RI, R being the external resistance, both V and I must change as R changes, and so must the phases of emission at both surfaces relative to the time of zero voltage. Since the reactance of the electron discharge depends on both the magnitude and phase of the electron currents, the end result of changing the external resistance R is to change the resistance of the electron discharge, and hence the resonant frequency of the cavity.

We claim:

1. A resonant cavity device wherein a separate resonator is coupled to a resonant cavity of said device and a multipactor discharge arrangement is provided to influence said separate resonator, said separate resonator comprising a resonant transmission path extending between said multipactor discharge arrangement and said cavity and wherein said transmission path is of such length that said multipactor discharge arrangement is positioned at least approximately at a point at which appears in operation a high radio frequency voltage and which is approximately a distance from the end of said transmission path adjacent said cavity equal to $n\lambda/4$ and said transmission path extends beyond said multipactor discharge arrangement to a total length equal to $m\lambda/2$ and is short circuited at its end remote from said cavity, where $n$ is one of a series of odd whole numbers including unity; $\lambda$ is the wavelength corresponding to the mean frequency between the two extremes of frequency obtained as a result of initiating and inhibiting discharge of said multipactor arrangement and $m$ is a whole number.

2. A device as claimed in claim 1 and wherein said resonant cavity device is a magnetron oscillator and said transmission path is a co-axial transmission line, the outer conductor of which terminates at the wall of the anode member of said magnetron oscillator and the inner conductor of which extends through an aperture provided in said wall.

3. A device as claimed in claim 2 and wherein said inner conductor is provided with at least one liquid coolant passage having input and output ports at the end of the inner conductor adjacent said short circuit.

4. A device as claimed in claim 2 and wherein the multipactor discharge arrangement is in the form of two co-axial cylinders, one of which is carried by and electrically common with said inner conductor and the other of which is separate from the outer conductor of said co-axial transmission line and supported by an electrode passing through said outer conductor by means of an insulator and choke system, whereby bias potential may be applied via said supporting electrode to said other cylinder.

5. A device as claimed in claim 2 and wherein a discontinuity is provided in said inner conductor between said multipactor discharge arrangement and said cavity and the means for short circuiting the end of said transmission line is adjustable whereby the length of the gap provided by said discontinuity may be adjusted to adjust the coupling between the cavity and the multipactor discharge arrangement.

6. A device as claimed in claim 2 and wherein the total length of said co-axial transmission line is one and a half wavelengths.

7. A device as claimed in claim 2 and wherein the total length of said co-axial transmission line is one wavelength.

* * * * *